United States Patent [19]

Matsumura et al.

[11] Patent Number: 4,873,115

[45] Date of Patent: Oct. 10, 1989

[54] METHOD OF SYTHESIZING CARBON FILM AND CARBON PARTICLES IN A VAPOR PHASE

[75] Inventors: Mitsuo Matsumura; Toshihiko Yoshida, both of Saitama, Japan

[73] Assignee: Toa Nenryo Kogyo K.K., Tokyo, Japan

[21] Appl. No.: 765,573

[22] Filed: Aug. 14, 1985

Related U.S. Application Data

[63] Continuation of Ser. No. 523,249, Aug. 15, 1983, abandoned.

[30] Foreign Application Priority Data

Aug. 13, 1982 [JP] Japan .................................. 57-141559

[51] Int. Cl.$^4$ ............................................. B05D 3/06
[52] U.S. Cl. ........................................ 427/34; 427/37; 427/38; 427/39; 427/249; 427/255
[58] Field of Search ..................... 427/39, 37, 34, 38, 427/249, 255; 423/458, 445, 446

[56] References Cited

U.S. PATENT DOCUMENTS

| | | | |
|---|---|---|---|
| 3,138,435 | 6/1964 | Diefendorf | 427/249 |
| 3,335,345 | 8/1967 | Diefendorf | 427/249 |
| 3,684,585 | 8/1972 | Stroup et al. | 427/249 |
| 3,771,976 | 11/1973 | Wakefield | 427/249 |
| 4,040,870 | 8/1977 | Holzl | 427/249 |
| 4,434,188 | 2/1984 | Kamo et al. | 427/39 |
| 4,439,463 | 3/1984 | Miller | 427/39 |

*Primary Examiner*—Janyce Bell
*Attorney, Agent, or Firm*—Sughrue, Mion, Zinn, Macpeak & Seas

[57] ABSTRACT

A vapor phase synthesis of carbon film and carbon particles using a single or a mixed gas capable of supplying halogen, hydrogen and carbon atoms is disclosed. Halogen radicals can suppress the desorption of carbon atoms from the substrate, and the carbon layer is obtained easily. Especially chlorine and fluorine atoms are effective. An electron beam diffraction pattern illustrated that diamond film can be obtained in this method.

12 Claims, 2 Drawing Sheets

TRANSMISSION ELECTRON
DIFFRACTION PATTERN

FIG. I

STANDARD SPOT PATTERNS FOR
DIAMOND STRUCTURE

THE BEAM DIRECTION [011]

TABLE 1

COMPARISON OF OBSERVED INTERLAYER SPACINGS WITH
REPORTED VALUES.

| OBSERVED | | REPORTED (ASTM 6-0675) | | |
|---|---|---|---|---|
| d[A] | I | d[A] | $I/I_1$ | hkl |
| 2.06 | s | 2.06 | 100 | 111 |
| 1.26 | m | 1.261 | 27 | 220 |
| 1.07 | s | 1.0754 | 16 | 311 |
| 0.88 | m | 0.8916 | 7 | 400 |
| 0.81 | w | 0.8182 | 15 | 331 |

METHOD OF SYTHESIZING CARBON FILM AND CARBON PARTICLES IN A VAPOR PHASE

This application is a continuation Ser. No. 06/523,249 filed filed 8/15/83 which is now abandoned.

BACKGROUND OF THE INVENTION

1. Field of the Invention

This invention relates to a method of synthesizing carbon film and carbon particles by a vapor phase reaction.

2. Description of the Prior Art

Heretofore, diamond has been industrially applied to cutter and cutting tools because of its high hardness. Recently, however, many studies on the synthesis of diamond film have been carried out, since the diamond has not only good thermal conductivity but also has a possibility of preparing a semiconductor to provide a heat-resistant electronic device.

It is known that diamond can be synthesized not only at a high temperature under high pressure, but also its crystal can be grown under low pressure by using a gaseous carbon compound (see, for example, U.S. Pat. Nos. 3,030,187 and 3,030,188).

Only a diamond crystal smaller than that obtained in high pressure method is obtained by the low pressure method, but the low pressure method is attractive in the following reasons: firstly, it is possible to synthesize a thin film which may be utilized as a semiconductor; secondery, it is not difficult to introduce impurity elements to get the semiconductor. Recently, an excellent method using methane gas as a starting material was reported.

In order to obtain a carbon film as a semiconductor, however, it is necessary to prevent unforeseen impurities from being incorporated therein (the tendency is strong when the pressure is the reaction chamber is high) and to control a film thickness carefully.

Therefore it is preferable to synthesize the carbon film in a lower pressure. The pressure applied in the conventional method, however, is in the range of several to several tens of Torr, then the conventional method has a disadvantage in that it is impossible to stably produce the film under a pressure lower than that specified above.

We have made studies on carbon film expecting that a carbon film having a uniform structure (just as hydrogenated amorphous silicon has) can be satisfactorily utilized as a semiconductor material even if the film does not have a perfect diamond structure.

SUMMARY OF THE INVENTION

Accordingly, a first object of the present invention is to provide a process for producing carbon film and carbon particles in which the reaction is carried out in a mild condition to prevent unforeseen impurities from being incorporated in the carbon film.

A second object of the present invention is to provide a process for producing carbon film and carbon particles in which the control of the thickness of films can be easily made.

Thus, the present invention provides a method of synthesizing carbon film and carbon particles characterized in that a single or a mixed gas capable of supplying halogen, hydrogen, and carbon atoms is used as a starting material.

According to present invention, it is possible to lower the temperature of the substrate below that of the conventional method when the vapor phase synthesis is carried out under a pressure below several hundreds of mTorr. When the substrate temperature is above 200° C., it is not necessary to increase the pressure in the reaction chamber above several hundreds of mTorr; this is impossible in the conventional method. Thus, reaction conditions, such as, the substrate temperature and the reaction pressure may be varied over wide ranges.

The carbon film and the carbon particles produced in present invention have basically a tetrahedral structure based on carbon-to-carbon bonds, and hence they have a high hardness similar to that of diamond and have excellent thermal properties. When they are doped with an impurity, they can act as a semiconductor. Therefore, they may be used in various purposes, such as abrasive grain, edges of processing or cutting tools, coating agent, heat-radiating plate of semiconductor element, and heat-resistant semiconductor element.

When a vapor phase synthesis is carried out by using a gas capable of supplying halogen, hydrogen, and carbon atoms as a starting material, carbon film and carbon particles can be synthesized in a very mild reaction condition, and the film thickness can be subtly controled.

DESCRIPTION OF THE PREFERRED EMBODIMENTS

Figure 1:
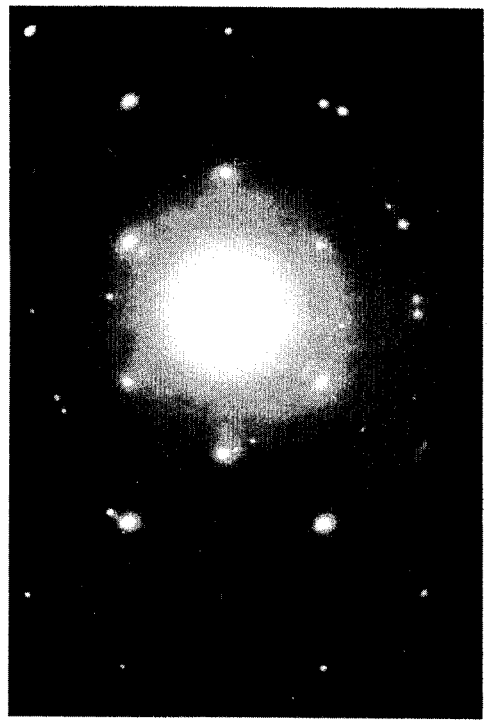
FIG. 1 is the picture which illustrates the electron beam diffraction pattern of carbon film obtained in this invention.

The "gas capable of supply halogen atoms" used in present invention includes not only halogen molecules but also compounds which contain halogen atoms in the molecular structure and have a vapor pressure of above several Torr at ordinary temperature. Some of these compounds include inorganic compounds such as halogenated silanes as well as halogenated organic compounds.

The halogen atom in present invention can contribute to stabilize the structure of carbon film and carbon particles by following ways: since the halogen atom is very effective in forming ions or radicals from hydrocarbons or from halogen containing compounds, which are the source of carbon atoms, the reaction can be easily occurred in a plasma atmosphere to produce carbon film and carbon particles; the following surface growth reaction (which is occurred during the growth of the carbon film and the carbon particles), which is conected with bonding between halogen and hydrogen, is very helpful in forming a tetrahedral structure based on the carbon-to-carbon bonds of the carbon film and the carbon particles,

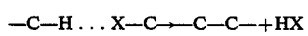

wherein X is a halogen atom; the halogen atom can decrease the dangling bonds in the carbon film and the carbon particles by getting into them and bond with carbon atoms. Thus, halogen atoms having smaller atomic radius and can form strong bond with a hydrogen atom are preferable. The preferred halogen atoms are fluorine and chlorine. Especially, fluorine is preferable for the stable synthesis of the carbon film and the carbon particles under low pressure. Thus, in present invention, the following molecules are preferable as gases which can supply halogen atom: fluorine molecule, fluorinated paraffinic hydrocarbons, fluorinated olefinic hydrocarbons, fluorinated alycyclic hydrocarbons, fluorinated aromatic hydrocarbons and fluorosilanes ($SiH_O \sim 3 F_4 \sim 1$). Among these compounds, $C_1$ to $C_6$ fluorohydrocarbons such as fluoromethane, fluoroethane, trifluoromethane and fluoroethylene, fluorocyclohexane and tetrafluorosilane are particularly preferred.

The "gas capable of supplying hydrogen atoms" used in present invention includes not only hydrogen but also compounds which have a vapor pressure of above several Torr at ordinary temperature. Some of these compounds include aliphatic hydrocarbons such as methane, ethane and propane; aromatic hydrocarbons such as benzene and naphthalene; unsaturated hydrocarbons such as ethylene and propylene; ammonia, hydrazine and organic compounds having a hetero atom.

The "gas capable of supplying carbon atoms" used in present invention includes lower hydrocarbons, higher hydrocarbons having a vapor pressure of above several Torr at ordinary temperature and halogenated hydrocarbons.

In present invention, these gases may be used as a mixture. If necessary, the mixed gas may be diluted with an inert gas such as helium, neon or argon. When a gas containing halogen, hydrogen, and carbon atoms in the same molecule (e.g., fluoroethane etc.) is used, the gas may be used alone.

The vapor phase synthesis of present invention is carried out in such a manner that the gas in a reaction chamber is brought into a plasma state by electrical discharge or the like. In the conventional method using methane as a starting material, it is impossible to stably produce a carbon film, when the pressure in the reaction chamber is as low as several hundreds of mTorr and the temperature of a substrate is 250° C. or higher, because the desorption rate of the carbon atom from the surface of the substrate is greater than the deposition rate; the desorption of carbon atom is mainly caused by hydrogen in the reaction chamber. In present invention, halogen and hydrogen atoms formed in the vapor phase react with each other to form a hydrogen halide, then an excess of activated hydrogen radicals present in the vapor phase is reduced and the desorption rate of the carbon atom is suppressed. Thus, the carbon film can be stably produced in present invention. The suitable conditions of the vapor phase synthesis in present invention is as follows: the present in the reaction chamber is in the range of about 10 mTorr to several tens of Torr; and the temperature of the substrate is about 200° to 900° C.

In present invention, the gas in the reaction chamber can be brought into a plasma state by means such as high-frequency glow discharge, low-frequency glow discharge, arc discharge, or plasma jet method. The power density is about 0.4 to 3.0 W/cm². Some substrate, such as, glass plates, crystalline silicon or metallic sheets may be used in present invention.

As a result, when a carbon film is produced by the method of present invention, the structure of the carbon film is, microscopically, a tetrahedral based on carbon-to-carbon bonds, that is, a diamond structure, but macroscopically this structure is disturbed to form so-called dangling bonds. But the structural instability due to above disturbance can be moderated by make bonds between hydrogen or halogen atoms and carbon atoms when halogen atoms exist in the reaction chamber. Above reactions of the halogen atom can prevent the formation of dangling bonds, and the entire carbon film can be moderated into a diamond-like amorphous carbon film.

EXAMPLES

The following examples are provided to illustrate present invention, but are not to be construed as limiting the present invention in any way.

EXAMPLE 1

Figure 2:
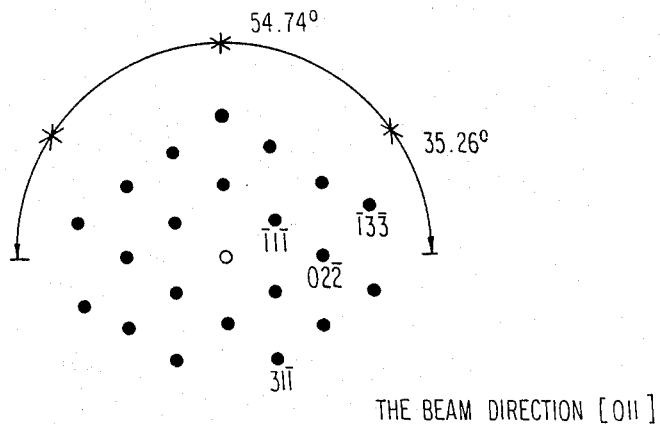
FIG. 2 illustrates the electron beam diffraction pattern of diamond disclosed in prior work.

A plasma CVD apparatus was used. A mixed gas of $CH_4$ and $CF_4$ (about 1:4) at an overall flow rate of $CH_4$ and $CF_4$ of about 10 SCCM (standard cubic centimeter) was introduced into the reaction chamber. The reaction chamber was kept under a pressure of about 100 mTorr, then discharged electrically in a power density of about 3.0 W/cm² to form a plasma state. In this state, a carbon film was produced on the surface of a silicon crystal substrate heated to about 350° C. Electron beam diffraction analysis (FIG. 1) showed that the carbon film had a diffraction pattern of diamond (FIG. 2). Moreover, table 1 illustrate that plane distances calculated from FIG. 1 are same to those of diamond. Elemental analysis by EPMA (electron probe microanalysis) showed that no fluorine atom was present at all. The C—H vibration mode was analysed by infrared spectroscopy to reveal that about 6% of hydrogen atoms was present in the film.

TABLE 1

Comparison of observed interlayer spacings with reported values.

| Observed | | Reported (ASTM 6-0675) | | |
|---|---|---|---|---|
| d[A] | I | d[A] | $I/I_1$ | hkl |
| 2.06 | S | 2.06 | 100 | 111 |
| 1.26 | M | 1.261 | 27 | 220 |
| 1.07 | S | 1.0754 | 16 | 311 |
| 0.88 | M | 0.8916 | 7 | 400 |
| 0.81 | W | 0.8182 | 15 | 331 |

In table 1, I means the peak strength.

EXAMPLE 2

The procedure of Example 1 was repeated using quartz glass as a substrate. Electron beam diffraction analysis showed that the produced carbon film had a diffraction pattern of diamond shown above.

EXAMPLE 3

A mixed gas of $SiF_4$ and $CH_4$ (9:1) diluted with argon gas was used as a plasma discharge gas. The procedures of Examples 1 and 2 were repeated except that the pressure in the reaction chamber was 200 mTorr, the power density was 0.6 W/cm² and the temperature of the substrate was 250° C. A carbon film was produced on the surface of each silicon crystal and quartz glass. Electron beam diffraction analysis showed that the films had a diffraction pattern of diamond. EPMA showed that neither silicon nor fluorine atoms were present in the films at all. This fact may suggest that $SiF_4$ as a fluorine source was present in the form of $SiF_2$ in the plasma.

EXAMPLE FOR COMPARISON

The procedure of Example 1 was repeated except that single methane gas was used in place of a mixed gas of $CH_4$ and $CF_4$. The formation of carbon film was not found.

What is claimed is:

1. A method of synthesizing a carbon film consisting essentially of carbon and carbon particles consisting essentially of carbon on a heated substrate in a vapor phase which comprises using a single gas or a mixed gas capable of supplying halogen, hydrogen and carbon atoms as a starting material and carrying out the process by having the gas in a plasma state with the temperature of the substrate being from about 100° to 900° C. and with process being carried out under a pressure of from about 10 mm Torr to several tens of Torr until said carbon film and carbon particles deposit on the substrate while heated to about 100° to 900° C.

2. A method of synthesizing carbon film and carbon particles as set forth in claim 1 wherein the halogen atom is a fluorine atom and/or chlorine atom.

3. A method of synthesizing carbon film and carbon particles in a vapor phase as set forth in claim 2, wherein the halogen atom is fluorine atom.

4. A method of synthesizing carbon film and carbon particles in a vapor phase as set forth in claim 1, wherein the starting gas is diluted with a hydrogen and/or inert gas.

5. A method of synthesizing carbon film and carbon particles in a vapor phase as set forth in claim 1, wherein the sum of the hydrogen and the halogen contents in the carbon film and in carbon particles formed is less than 15 atom %.

6. A method of synthesizing carbon film and carbon particles in a vapor phase as set forth in claim 1, wherein the carbon film formed is a diamond film.

7. A method of synthesizing carbon film and carbon particles in a vapor phase as set forth in claim 1, wherein the carbon particles formed are diamond particles.

8. A method of synthesizing carbon film and carbon particles in a vapor phase as set forth in claim 5, wherein the carbon film formed is a diamond film.

9. A method of synthesizing carbon film and carbon particles in a vapor phase as set forth in claim 5, wherein the carbon particles formed are diamond particles.

10. A method of synthesizing carbon film and carbon particles as set forth in claim 3 wherein the starting material is a fluorohydrocarbon.

11. A method of synthesizing carbon film and carbon particles as set forth in any one of claims 3, 4, 1, 2 or 10 wherein the plasma state is generated by means selected from the group consisting of glow discharge, arc discharge and plasma jet methods.

12. A method of synthesizing a material selected from the group consisting of a carbon film consisting essentially of carbon and carbon particles consisting essentially of carbon on a heated substrate in a vapor phase which comprises using a single gas or mixed gas capable of supplying halogen, hydrogen and carbon atoms as a starting material and carrying out the process by having the gas in a plasma state with the temperature of the substrate being from about 100° to 900° C. and with process being carried out under a pressure of from about 10 mm Torr to several tens of Torr until said material selected from the group consisting of carbon film and carbon particles deposits on the substrate being heated to about 100° to 900° C.

* * * * *